(12) United States Patent
Do et al.

(10) Patent No.: US 9,224,785 B2
(45) Date of Patent: Dec. 29, 2015

(54) ELECTRONIC DEVICE AND METHOD FOR FABRICATING THE SAME

(71) Applicant: SK hynix Inc., Icheon-Si (KR)

(72) Inventors: Kwan-Woo Do, Icheon-Si (KR); Ki-Seon Park, Icheon-Si (KR)

(73) Assignee: SK HYNIX, INC., Icheon-Si (KR)

( * ) Notice: Subject to any disclaimer, the term of this patent is extended or adjusted under 35 U.S.C. 154(b) by 0 days.

(21) Appl. No.: 14/586,779

(22) Filed: Dec. 30, 2014

(65) Prior Publication Data

US 2015/0249110 A1    Sep. 3, 2015

(30) Foreign Application Priority Data

Feb. 28, 2014    (KR) .................. 10-2014-0023998

(51) Int. Cl.
| | | |
|---|---|---|
| *H01L 27/22* | (2006.01) | |
| *H01L 27/115* | (2006.01) | |
| *H01L 43/02* | (2006.01) | |
| *H01L 43/08* | (2006.01) | |
| *H01L 45/00* | (2006.01) | |

(52) U.S. Cl.
CPC .............. *H01L 27/222* (2013.01); *H01L 43/02* (2013.01); *H01L 43/08* (2013.01); *H01L 45/06* (2013.01)

(58) Field of Classification Search
CPC ............ H01L 27/8507; H01L 27/1052; H01L 27/115; H01L 27/222; H01L 45/06
USPC .................. 257/379, 529; 438/3, 382
See application file for complete search history.

(56) References Cited

U.S. PATENT DOCUMENTS

| | | | |
|---|---|---|---|
| 2008/0272358 A1* | 11/2008 | Lin et al. ............................. | 257/4 |
| 2009/0057640 A1* | 3/2009 | Lin et al. ............................. | 257/3 |
| 2009/0090899 A1* | 4/2009 | Lim et al. ........................... | 257/4 |
| 2010/0163828 A1* | 7/2010 | Tu ...................................... | 257/3 |
| 2011/0284815 A1* | 11/2011 | Kim et al. .......................... | 257/4 |
| 2012/0091422 A1* | 4/2012 | Choi et al. ......................... | 257/4 |
| 2012/0273741 A1* | 11/2012 | Hwang et al. ..................... | 257/2 |
| 2013/0193402 A1* | 8/2013 | Ryu .................................... | 257/5 |
| 2014/0021551 A1* | 1/2014 | Nam et al. ..................... | 257/365 |
| 2014/0138607 A1* | 5/2014 | Ito et al. ............................. | 257/4 |

FOREIGN PATENT DOCUMENTS

KR    1020100018814 A    2/2010

* cited by examiner

*Primary Examiner* — George Fourson, III
(74) *Attorney, Agent, or Firm* — Perkins Coie LLP

(57) ABSTRACT

An electronic device includes a semiconductor memory that includes: an inter-layer dielectric layer which is formed over a substrate; a contact plug which is coupled with the substrate by passing through the inter-layer dielectric layer and has a protruding portion over the inter-layer dielectric layer; a first variable resistance pattern which is formed over the contact plug; and a protective layer which covers the first variable resistance pattern and a portion of sidewalls of the contact plug in such a manner that the sidewalls of the contact plug are exposed.

20 Claims, 9 Drawing Sheets

ELECTRONIC DEVICE AND METHOD FOR FABRICATING THE SAME

CROSS-REFERENCE TO RELATED APPLICATIONS

This patent document claims priority and benefits of Korean Patent Application No. 10-2014-0023998, entitled "ELECTRONIC DEVICE AND METHOD FOR FABRICATING THE SAME" and filed on Feb. 28, 2014, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such semiconductor devices include electronic devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which a semiconductor memory and a method for fabricating the electronic device have improved reliability.

In one aspect, an electronic device is provided to include a semiconductor memory that comprises: a substrate; an inter-layer dielectric layer which is formed over a substrate; a contact plug which is coupled with the substrate by passing through the inter-layer dielectric layer and has a protruding portion over the inter-layer dielectric layer; a first variable resistance pattern which is formed over the contact plug; and a protective layer which covers the first variable resistance pattern and a portion of sidewalls of the contact plug in such a manner that exposes a remaining portion of the sidewalls of the contact plug.

In some implementations, the electronic device may further include: a second variable resistance pattern which is formed to surround a portion of the remaining portion of the sidewalls of the contact plug. In some implementations, the sidewalls of the second variable resistance pattern is aligned to the sidewalls of the protective layer. In some implementations, the first variable resistance pattern and the second variable resistance pattern are spaced apart from each other in a vertical direction. In some implementations, the second variable resistance pattern includes the same material as the first variable resistance pattern. In some implementations, the first variable resistance pattern includes a magnetic tunnel junction including a tunnel barrier interposed between two magnetic materials, and the second variable resistance pattern may include a magnetic material for improving a characteristic of the magnetic tunnel junction. In some implementations, the protective layer may include: a first insulation layer which is formed over a surface of a structure to cover the first variable resistance pattern and a portion of the sidewalls of the contact plug; and a second insulation layer over the first insulation layer corresponding to the upper surface of the first variable resistance pattern. In some implementations, the height of the contact plug protruding over the inter-layer dielectric layer is greater than the height of the first variable resistance pattern.

In another aspect, an electronic device may include: a substrate; an inter-layer dielectric layer which is formed over the substrate; lower contact plugs formed through the inter-layer dielectric layer and having protruding portions over the inter-layer dielectric layer; first variable resistance patterns formed over and in electrical contact with the lower contact plugs, respectively, so that the first variable resistance patterns are located above and separated from the inter-layer dielectric layer; upper contact plugs formed over and in electrical contract with the first variable resistance patterns, respectively so that each first variable resistance pattern is in electrical contact between a corresponding upper contact plug and a corresponding lower contact plug; and a magnetic structure formed over the substrate and located below top portions of lower contact plugs so as to be separated from the first variable resistance patterns, the magnetic structure producing a magnetic field at the first variable resistance patterns, wherein each first variable resistance pattern is isolated by a corresponding lower contact plug protruding over the inter-layer dielectric layer. In some implementations, the electronic device may further include: protective layers formed around the first variable resistance patterns, respectively, each covering a corresponding first variable resistance pattern and a portion of sidewalls of a corresponding lower contact plug while exposing a remaining portion of the sidewalls of the corresponding lower contact plug, wherein each upper contact plug for a corresponding first variable resistance pattern passes through a corresponding protective layer for the corresponding first variable resistance pattern. In some implementations, each protective layer may include: a first insulation layer which is formed over a surface of a structure to cover a corresponding first variable resistance pattern and a portion of the sidewalls of a corresponding lower contact plug; and a second insulation layer over the first insulation layer corresponding to the upper surface of the corresponding first variable resistance pattern. In some implementations, wherein the magnetic structure includes a second variable resistance pattern that surrounds the exposed sidewalls of the lower contact plug. In some implementations, each first variable resistance pattern and the second variable resistance pattern are spatially separated by placing the second variable resistance pattern below each first variable resistance pattern. In some implementations, each second variable resistance pattern includes the same structure and materials as the first variable resistance pattern. In some implementations, each first variable resistance pattern includes a magnetic tunnel junction including a tunnel barrier interposed between two magnetic materials, and each second variable resistance pattern may include a magnetic material for improving a characteristic of the magnetic tunnel junction. In some implementations, the height of the lower contact plugs protruding over the inter-layer dielectric layer may be greater than the height of the first variable resistance patterns.

In another aspect, an electronic device is provided to include: a substrate; an inter-layer dielectric layer which is formed over the substrate; lower contact plugs formed through the inter-layer dielectric layer and having protruding portions over the inter-layer dielectric layer, each protruding portions distantly spaced from each other; and first variable resistance patterns respectively formed over the lower contact plugs, each variable resistance pattern being in electrical contact with a corresponding lower contact plug, and each variable resistance pattern including a first magnetic layer having a variable magnetization direction, a second magnetic layer having a pinned magnetization direction, and a tunnel barrier layer interposed between the first magnetic layer and the second magnetic layer, wherein each variable resistance pattern is distantly formed from the inter-layer dielectric layer and has a vertical profile aligned with an edge of a corresponding lower contact plug.

In some implementations, the electronic device further includes: magnetic structures formed around the lower contact plugs over the inter-layer dielectric layer, respectively, to be spaced apart from the first variable resistance elements, wherein each magnetic structure produces a magnetic field at the first magnetic layer of a corresponding first variable resistance element to prevent a magnetic field produced by the second magnetic layer to bias the first magnetic layer. In some implementations, wherein: the magnetic structures are second variable resistance elements which have the same structures as the first variable resistance elements. In some implementations, wherein the height of the lower contact plug protruding over the first inter-layer dielectric layer is greater than the height of the first variable resistance pattern.

In another aspect, a method for fabricating an electronic device is provided to include: forming an inter-layer dielectric layer over a substrate; forming a lower contact plug passing through the inter-layer dielectric layer; protruding a portion of the lower contact plug over the inter-layer dielectric layer by recessing the inter-layer dielectric layer; and simultaneously forming a first variable resistance pattern which is self-isolated over the lower contact plug, and a second variable resistance pattern over the inter-layer dielectric layer to be isolated from the first variable resistance pattern. In some implementations, the height of the lower contact plug protruding over the inter-layer dielectric layer may be greater than the heights of the first and second variable resistance patterns. In some implementations, the first variable resistance pattern and the second variable resistance pattern are spaced apart from each other in a vertical direction. In some implementations, the sidewalls of the first variable resistance pattern have vertical profiles by being aligned to the edge of the protruding lower contact plug. In some implementations, the forming of the first variable resistance pattern and the second variable resistance pattern is performed through a deposition process where the step coverage may be poor. In some implementations, the first variable resistance pattern and the second variable resistance pattern may be formed through a sputtering method. In some implementations, the method further may include: forming a protective layer which covers the first variable resistance pattern; and selectively etching the second variable resistance pattern between the first variable resistance patterns until the inter-layer dielectric layer may be exposed. In some implementations, the method further may include: eliminating the remaining second variable resistance pattern. In some implementations, the protective layer may be formed to cover the first variable resistance pattern and a portion of the sidewalls of the lower contact plug.

In some implementations, the sidewalls of the first variable resistance patterns have vertical profiles by being respectively self-aligned to the edge of the lower contact plug. In some implementations, the first variable resistance pattern may include a metal oxide, a phase change material or a ferroelectric material. In some implementations, the electronic device may further include a microprocessor which may include: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation may be performed, wherein the semiconductor memory may be part of the memory unit in the microprocessor. The electronic device may further include a processor which may include: a core unit configured to perform, based on a command inputted from an outside of the processor, an operation corresponding to the command, by using data; a cache memory unit configured to store data for performing the operation, data corresponding to a result of performing the operation, or an address of data for which the operation may be performed; and a bus interface connected between the core unit and the cache memory unit, and configured to transmit data between the core unit and the cache memory unit, wherein the semiconductor memory may be part of the cache memory unit in the processor. The electronic device may further include a processing system which may include: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory may be part of the auxiliary memory device or the main memory device in the processing system. The electronic device may further include a data storage system which may include: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory may be part of the storage device or the temporary storage device in the data storage system. The electronic device may further include a memory system which may include: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory may be part of the memory or the buffer memory in the memory system.

Those and other aspects of the disclosed technology and their implementations and variations are described in greater detail in the drawings, the description and the claims.

DETAILED DESCRIPTION

Figure 1:
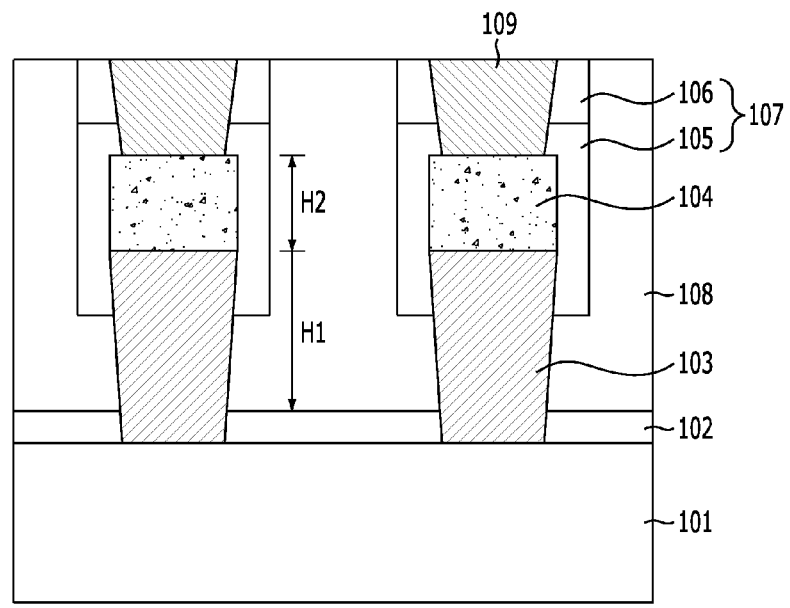
FIG. 1 is a cross-sectional view illustrating an example of a semiconductor memory in accordance with an implementation of the technology disclosed in this patent document.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

The implementation of this patent document, which is to be described below, provides an electronic device including a semiconductor memory and a method for fabricating the electronic device, of which the reliability is improved. The reliability of the semiconductor memory is directly affected by the reliability of a storage element which stores information. Therefore, the following implementation improves the reliability of the storage element. Hereinafter, a variable resistance element is described as an example of a storage element, which can be implemented in various configurations, including configurations for the next-generation semiconductor memory devices. The variable resistance element exhibits a variable resistance which can be switched between different resistance states in response to a bias, e.g., a current or a voltage, supplied to the variable resistance element. The variable resistance element may include a variable resistance material which is used for a resistance memory where information is stored and eliminated based on a change of the resistance property. The variable resistance material may include various materials used for an RRAM (resistive random access memory), a PRAM (phase change random access memory), an FRAM (ferroelectric random access memory), an MRAM (magnetic random access memory), or a STTRAM (spin transfer torque random access memory), etc. For example, the variable resistance material may include a ferromagnetic material, a transition metal oxide, a metal oxide including a perovskite-based material, a phase change material including a chalcogenide-based material, or a ferroelectric material, etc.

Hereinafter, an MTJ (magnetic tunnel junction) is described as one example, where a tunnel barrier is interposed as a variable resistance element between two magnetic materials. Such descriptions are provided for the sake of convenience, and other elements can be used for the variable resistance element instead of the MTJ.

Figure 2:
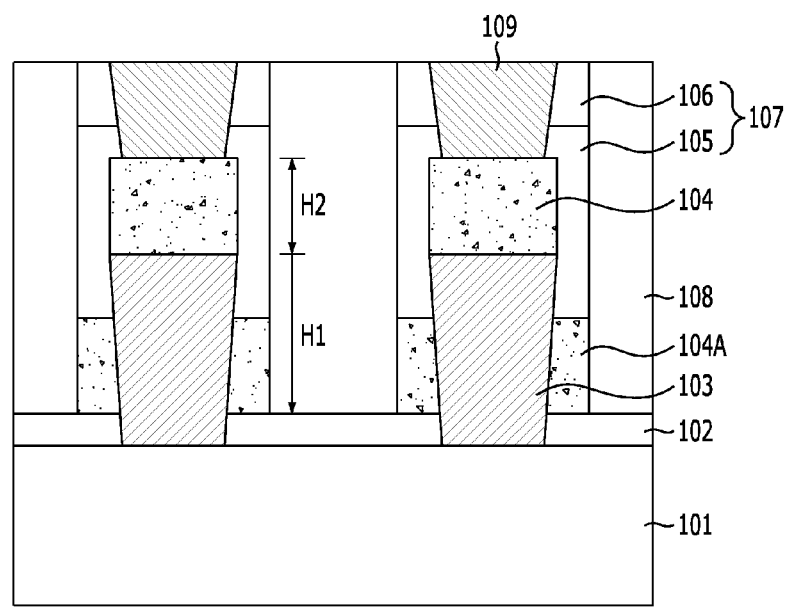
FIG. 2 is a cross-sectional view exemplarily illustrating a modified semiconductor memory in accordance with one implementation of the disclosed technology.

FIG. 1 is a cross-sectional view illustrating a semiconductor memory in accordance with an implementation. FIG. 2 is a cross-sectional view exemplarily illustrating a modified semiconductor memory in accordance with one implementation.

Referring to FIG. 1, the semiconductor memory may include a plurality of lower contact plugs 103 and first variable resistance patterns 104 formed on top of the lower contact plugs 103, respectively, and below upper contact plugs 109, respectively. Each lower contact plug 103 is structured to form over the substrate 101 and to pass through or penetrates a first inter-layer dielectric layer 102 over the substrate 101 and includes a protruding portion that protrudes over or above the first inter-layer dielectric layer 102 to contact a bottom of a corresponding first variable resistance pattern 104. Hence, the first variable resistance pattern 104 is formed over each of the lower contact plugs 103. Each pair of a lower contact plug 103 and an upper contact plug 109 provides two electrical contacts to a corresponding first variable resistance pattern 104 as two electrical terminals of the first variable resistance pattern 104. A current or voltage is applied through the pair of a lower contact plug 103 and an upper contact plug 109 in operating the first variable resistance pattern. The first variable resistance pattern 104 is self-isolated by the lower contact plug 103 which protrudes over the first inter-layer dielectric layer 102. For example, the first variable resistance pattern 104 may be distantly disposed from the first inter-layer dielectric layer 102 formed over the substrate 101. Also, the sidewalls of the first variable resistance pattern 104 may be self-aligned to the edges of the lower contact plug 103 and have vertical profiles.

Hereafter, the constituent elements of the semiconductor memory are described in detail.

The semiconductor memory may include a substrate 101 where a select element (not shown) is formed for each first variable resistance pattern 104 to select the first variable resistance pattern 104 for reading or writing operation and the first inter-layer dielectric layer 102 which is formed over the substrate 101.

The substrate 101 may include a semiconductor substrate. The semiconductor substrate may include a single crystal state and contain a silicon-containing material. In other words, the semiconductor substrate may include a single crystal silicon-containing material. For example, the substrate 101 may include a bulk silicon substrate or a Silicon On Insulator (SOI) substrate where a support substrate, a buried insulation layer and a single crystal silicon layer are sequentially stacked.

The select element is used for selecting a plurality of unit cells, one unit cell from a plurality of first variable resistance patterns 104, or the first variable resistance pattern 104. The select element may include a transistor or diode, and so on. One side of the select element may be electrically connected to the lower contact plug 103, and the other side of the select element may be electrically connected to a line, e.g., a source line (not shown). The first inter-layer dielectric layer 102 may include a single layer including an oxide layer, a nitride layer, an oxynitride layer, or a stacked layer where two or more of the afore-mentioned layers are stacked.

The lower contact plugs 103 protrude over the first inter-layer dielectric layer 102 by passing through or penetrating the first inter-layer dielectric layer 102. Each of the lower contact plugs 103 electrically connects the first variable resistance pattern 104 to the select element (not shown). Also, the lower contact plug 103 may serve as a lower electrode of the first variable resistance pattern 104. As the lower contact plug 103 has a shape that includes a portion protruding over the first inter-layer dielectric layer 102, the lower contact plug 103 may self-isolate the first variable resistance pattern 104 without an etch process. Further, the lower contact plug 103 may induce the sidewalls of the first variable resistance pattern 104 to be self-aligned to the edge of the lower contact plug 103 so as to have vertical profiles. To this end, the height H1 of the lower contact plug 103 protruding over the first inter-layer dielectric layer 102 may be greater than the height H2 of the first variable resistance pattern 104. The lower contact plug 103 may be formed by gap-filling inside of a contact hole with a conductive material. Therefore, the lower contact plug 103 may have inclined sidewalls. The lower contact plug 103 may include a conductive material having excellent embedding characteristics and high electrical conductivity such as tungsten (W), tantalum (Ta), aluminum (Al) or a titanium nitride (TiN). The lower contact plug 103 may include a single layer including one conductive material, or a stacked layer including two or more conductive materials.

The semiconductor memory in accordance with one implementation may include a protective layer 107 which covers a portion of the sidewalls of lower contact plug 103 and an entire sidewalls of the first variable resistance pattern 104 so as to expose the sidewalls of the first variable resistance pattern 104 over the lower contact plug 103 and the lower contact plug 103.

The first variable resistance pattern 104 may operate as a storage element. The first variable resistance pattern 104 may be switched between different resistance states in response to a bias, e.g., a current or a voltage, supplied to the first variable resistance pattern 104. Therefore, the first variable resistance pattern 104 may include a Magnetic Tunnel Junction (MTJ) where a tunnel barrier is interposed between two magnetic materials. The magnetic tunnel junction may include a stacked structure where two magnetic layers (not shown) and a tunnel barrier layer (not shown) interposed between the magnetic layers are stacked. One of the magnetic layers may serve as a pinned layer of which the magnetization direction is pinned or a reference layer, and the other may serve as a free layer of which the magnetization direction is changed. The magnetic layers may include single layers or multi-layers including an alloy of Fe and Pt, an alloy of Fe and Pd, an alloy of Co and Pd, an alloy of Co and Pt, an alloy of Fe, Ni and Pt, an alloy of Co, Fe and Pt, or an alloy of Co, Ni and Pt, and so on. The tunnel barrier layer changes the magnetization direction of the free layer by tunneling an electric charge, e.g., an electron. The tunnel barrier layer may include a single layer or a multi-layer including an oxide such as MgO, CaO, SrO, TiO, VO, or NbO.

The protective layer 107 may be extended to cover the surface of the first variable resistance pattern 104 and a portion of a sidewall of the lower contact plug 103. For example, the protective layer 107 may include a first insulation layer 105 which covers the upper surface and sides of the first variable resistance pattern 104 and an upper portion of the sidewall of the lower contact plug 103, and a second insulation layer 106 which is formed over the first insulation layer 105. The first insulation layer 105 may be formed over the surface of the structure including the lower contact plug 103 and the variable resistance pattern 104. The first insulation layer 105 may cover and protect the structure including the upper portion of the lower contact plug 103 and the variable resistance pattern 104. The second insulation layer 106 prevents a loss of the first insulation layer 105. The first and second insulation layers 105 and 106 may include a single layer including an oxide layer, a nitride layer, or an oxynitride layer, or a stacked layer including the layers above. In one implementation, the first and second insulation layers 105 and 106 may include different insulation materials. For example, the first insulation layer 105 may include a nitride layer, and the second insulation layer 106 may include an oxide layer.

Referring to FIG. 2, a modified semiconductor memory is explained. The modified semiconductor memory may include a second variable resistance pattern 104A which surrounds the exposed sidewalls of the lower contact plug 103. The second variable resistance pattern 104A may be formed between the first inter-layer dielectric layer 102 and the protective layer 107. The second variable resistance pattern 104A may be discontinuously disposed while being separated from the first variable resistance pattern 104. For example, the first and second variable resistance patterns 104 and 104A are arranged in separate areas spaced apart from each other in a vertical direction. The sidewalls of the second variable resistance pattern 104A may be aligned to the sidewalls of the protective layer 107.

The second variable resistance pattern 104A is different from the first variable resistance pattern 104 in that second variable resistance pattern 104A does not serve as a storage element. The second variable resistance pattern 104A may not electrically affect the semiconductor memory. Rather, the second variable resistance pattern 104A may function to improve the characteristic of the first variable resistance pattern 104. For example, when the first variable resistance pattern 104 include a Magnetic Tunnel Junction (MTJ) where a tunnel barrier is interposed between two magnetic materials, the second variable resistance pattern 104A may include a magnetic material for improving the characteristic of the MTJ 104. In this regard, the second variable resistance pattern 104A may include a magnetic correction layer that produces a magnetic field at the MTJ 104 for preventing a magnetic field of the MTJ 104 from being undesirably biased by a magnetic field at its free layer by a pinned-magnetic material of the pinned layer of the MTJ 104 in which the magnetization direction is pinned. The magnetic correction layer in the second variable resistance pattern 104A offsets or reduces the effect of the magnetic field produced by the pinned layer of the MTJ 104 at the free layer of the MTJ 104 and thus prevents the magnetic field of the free-magnetic material of the MTJ 104 from being biased. The magnetic correction layer has an opposite magnetization direction to the pinned-magnetic material, and may include a ferromagnetic material or an anti-ferromagnetic material.

The presence of the second variable resistance pattern 104A may be selectively formed depending on various factors such as the required characteristics of a device or a fabrication process. The second variable resistance pattern 104A and the first variable resistance pattern 104 may be formed simultaneously. The second variable resistance pattern 104A may include the same structure and material as the first variable resistance pattern 104.

The semiconductor memory in accordance with one implementation may include an upper contact plug 109 and a second inter-layer dielectric layer 108. The upper contact plug 109 may contact with the first variable resistance pattern 104 by passing through or penetrating the protective layer 107. The second inter-layer dielectric layer 108 may be formed over the first inter-layer dielectric layer 102 and gap-fills the remaining un-filled portions. For example, the second inter-layer dielectric layer 108 may gap-fill between the structures each including the first variable resistance pattern 104. The upper contact plug 109 couples a line (not shown), e.g., a bit line to the first variable resistance pattern 104. The bit line may be formed over the second inter-layer dielectric layer 108. The upper contact plug 109 may serve as an upper electrode of the first variable resistance pattern 104. The upper contact plug 109 may be formed by gap-filling inside of a contact hole with a conductive material. Therefore, the upper contact plug 109 may have inclined sidewalls. The upper contact plug 109 may include a conductive material having excellent embedding characteristics and high electrical conductivity such as tungsten (W), tantalum (Ta), aluminum (Al), or a titanium nitride (TiN). The upper contact plug 109 may include a single layer including one conductive material, or a stacked layer including two or more conductive materials. The second inter-layer dielectric layer 108 may include a single layer including an oxide layer, a nitride layer or an oxynitride layer, or a stacked layer including two or more of the above layers.

The semiconductor memory having the aforementioned structure includes the first variable resistance pattern 104 which is self-isolated through the lower contact plug 103 protruding over the first inter-layer dielectric layer 102 and has vertical sidewalls. Thus, the reliability of the semiconductor memory may be greatly improved. This will be further described in the below, while explaining a method for fabricating a semiconductor memory.

FIGS. 3A through 3G are cross-sectional views illustrating a method for fabricating a semiconductor device in accordance with one implementation.

Figure 3A:
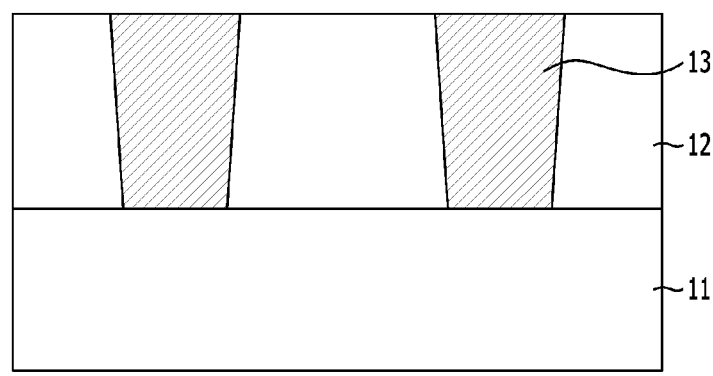
FIGS. 3A through 3G are cross-sectional views illustrating an example of a method for fabricating a semiconductor device in accordance with another implementation of the disclosed technology.

Referring to FIG. 3A, a required predefined structure is formed. For example, a substrate 11 in which a select element (not shown) is formed is prepared. The select element is for selecting a plurality of unit cells, one unit cell from a plurality of storage elements, or the storage elements. The select element may include a transistor, or diode and so on. One side of the select element may be electrically connected to a lower contact plug 13, and the other side of the select element may be electrically connected to a line, e.g., a source line, which is not shown in the drawing.

A first inter-layer dielectric layer 12 is formed over the substrate 11. The first inter-layer dielectric layer 12 may include a single layer including an oxide layer, a nitride layer, or an oxynitride layer, or a stacked layer including the two or more aforementioned layers. The first inter-layer dielectric layer 12 may be formed to have enough thickness to proceed a subsequent process.

A plurality of lower contact plugs 13 are formed to pass through or penetrate the first inter-layer dielectric layer 12. Each of the lower contact plugs 13 may be formed to be electrically connected to one side of the select element (not shown) formed in the substrate 11. The lower contact plug 13 may serve as an electrode of the storage element to be formed through a subsequent process.

The lower contact plug 13 may be formed through a series of processes including forming a contact hole by selectively etching the first inter-layer dielectric layer 12, forming a conductive layer over the contact hole so as to gap-fill the contact hole, performing a planarization process on the conductive layer until the first inter-layer dielectric layer 12 is exposed so that the lower contact plugs 13 disposed adjacent to each other are isolated from each other. The planarization process may be performed through a Chemical Mechanical Polishing (CMP) process or a blanket etch process, e.g., an etch-back process. The lower contact plug 13 may have inclined sidewalls by forming the contact hole through an etch process.

Since the lower contact plug 13 is formed by gap-filling the contact hole, the lower contact plug 13 may include a conductive material having excellent embedding characteristics and high electrical conductivity such as tungsten (W), tantalum (Ta), aluminum (Al) or a titanium nitride (TiN). The lower contact plug 13 may include a single layer including one conductive material, or a stacked layer including two or more conductive materials.

Figure 3B:
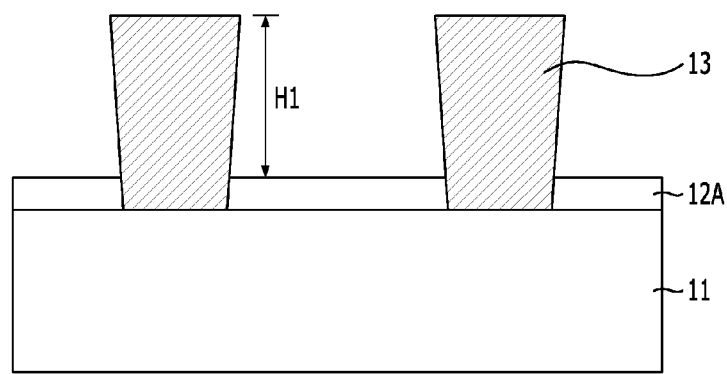

Referring to FIG. 3B, a portion of the lower contact plug 13 protrudes over the first inter-layer dielectric layer 12 by recessing the first inter-layer dielectric layer 12. The first inter-layer dielectric layer 12 having a predetermined thickness remains over the substrate 11. Hereafter, a recessed first inter-layer dielectric layer 12 is indicated as a reference numeral '12A'.

The first inter-layer dielectric layer 12A may be recessed through a wet etch process. For example, the first inter-layer dielectric layer 12A may be recessed through a dip-out process. A thickness or height H1 of the first inter-layer dielectric layer 12A which is eliminated through a recess process may be greater than a thickness (refer to a reference numeral 112' shown in FIG. 3C) of a variable resistance pattern which is to be formed through a subsequent process. In other words, the height H1 of the lower contact plug 13 which protrudes by recessing the first inter-layer dielectric layer 12A may be greater than the height of the variable resistance pattern (refer to the reference numeral 112' shown in FIG. 3C) which is to be formed through a subsequent process. This is to form a storage element which is self-isolated without an etch process in the subsequent process.

Figure 3C:
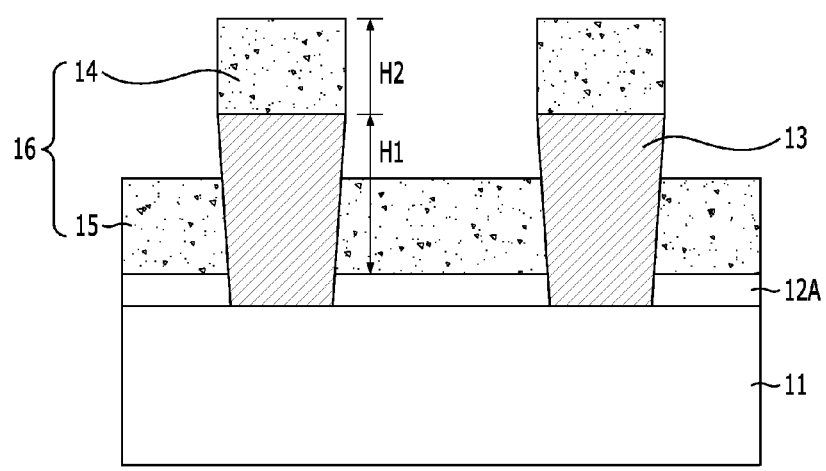

Referring to FIG. 3C, a variable resistance layer 16 is formed over the resultant structure including the lower contact plug 13 which protrudes over the first inter-layer dielectric layer 12A. The variable resistance layer 16 may include the first variable resistance pattern 14 and the second variable resistance pattern 15. The first and second variable resistance patterns 14 and 15 are discontinuous and formed in different areas spaced apart in a vertical direction. For example, the first variable resistance pattern 14 is formed over the lower contact plug 13, and the second variable resistance pattern 15 is formed over the first inter-layer dielectric layer 12A. The first and second variable resistance patterns 14 and 15 may be formed at the same time. The second variable resistance pattern 15 over the first inter-layer dielectric layer 12A and the first variable resistance pattern 14 over the lower contact plug 13 are separated from each other and arranged in discontinuous areas. The variable resistance layer 16 does not contact the sidewalls of the upper portion of the lower contact plug 13. In order to completely separate the first variable resistance pattern 14 from the second variable resistance pattern 15, the height or thickness of the first and second variable resistance patterns 14 and 15 needs to be shorter or smaller than that of the protruding portion of the lower contact plug 13 over the first inter-layer dielectric layer 12A. In other words, the height H1 of the lower contact plug 13 which protrudes over the first inter-layer dielectric layer 12A has to be longer than the height H2 of the first and second variable resistance patterns 14 and 15 (H1>H2).

The variable resistance layer 16 including the first variable resistance pattern 14 and the second variable resistance pattern 15, which are discontinuous and not connected to each other, may be formed through a deposition process. The deposition process may have the poor step coverage. For example, the variable resistance layer 16 may be formed through a Physical Vapor Deposition (PVD) method, e.g., a sputtering method. Such deposition process may be performed while the lower contact plug 13 protrudes over the first inter-layer dielectric layer 12A.

The variable resistance layer 16 may include a Magnetic Tunnel Junction (MTJ) where a tunnel barrier is interposed between two magnetic materials. Therefore, the first variable resistance pattern 14 and the second variable resistance pattern 15 may include the Magnetic Tunnel Junctions (MTJ). For example, the variable resistance layer 16 may include a stacked layer including two magnetic layers (not shown) and a tunnel barrier layer (not shown) interposed between the magnetic layers. One of the magnetic layers may serve as a pinned layer of which the magnetization direction is pinned or a reference layer, and the other may serve as a free layer of which the magnetization direction is changed. The magnetic layers may include single layers or multi-layers including an alloy of Fe and Pt, an alloy of Fe and Pd, an alloy of Co and Pd, an alloy of Co and Pt, an alloy of Fe, Ni and Pt, an alloy of Co, Fe and Pt, or an alloy of Co, Ni and Pt, and so on. The tunnel barrier layer changes the magnetization direction of the free layer by tunneling an electric charge, e.g., an electron. The tunnel barrier layer may include a single layer or a multi-layer including an oxide such as MgO, CaO, SrO, TiO, VO, or NbO.

In one implementation, the first variable resistance pattern 14 may serve as a storage element of the semiconductor memory and the second variable resistance pattern 15 does not serve as the storage element.

As described above, the first variable resistance pattern 14 may be formed to have vertical sidewalls by being self-isolated and self-aligned to the edge of the lower contact plug 13 without a subsequent etch process through a deposition process where the step coverage is poor during a formation process of the variable resistance layer 16 in a state where the lower contact plug 13 protrudes over the first inter-layer dielectric layer 12A. Consequently, problems caused by an etch process required for forming a storage element, e.g., a variable resistance pattern, as occurred in some other may be prevented.

When the variable resistance pattern is formed through the typical etch process, problems are caused, which involve a hard mask over the variable resistance pattern, the alignment between a lower contact plug and the variable resistance pattern and between the variable resistance pattern and a upper contact plug, an inclined sidewall profile of the variable resistance pattern, an etch damage of the variable resistance pattern, and so on. For example, regarding the inclined sidewall profile of the variable resistance pattern, there are difficulties to realize the vertical sidewall profile. Also, when the variable resistance pattern includes a great amount of metallic materials like a Magnetic Tunnel Junction (MTJ), additional problems may be caused, which include the limitation of an etch method and the occurrence of conductive by-products. However, the implementations of this patent document may fundamentally prevent the aforementioned problems.

Figure 3D:
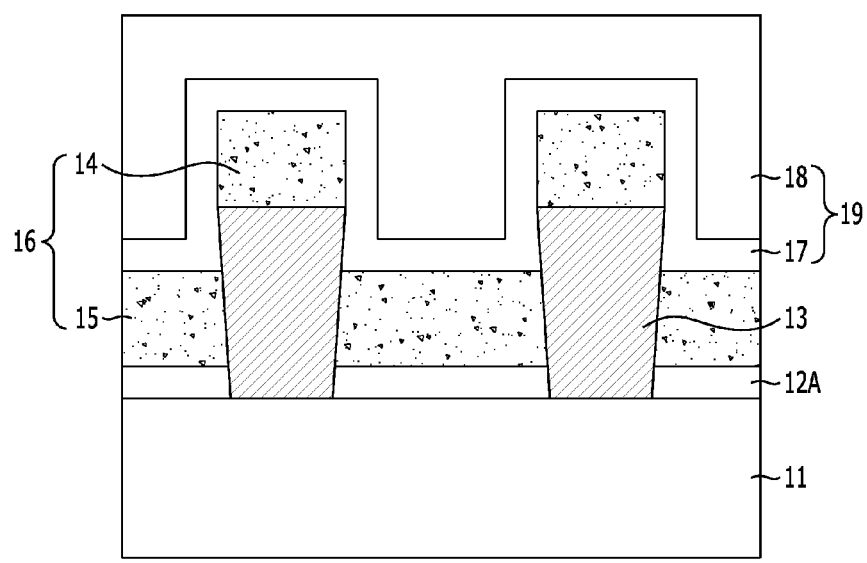

Referring to FIG. 3D, a first insulation layer 17 is formed over the surface of the resultant structure including the variable resistance layer 16. The first insulation layer 17 may be formed to have a uniform thickness over the surface of the resultant structure. Subsequently, a second insulation layer 18 is formed to cover the resultant structure where the first insulation layer is formed over the variable resistance layer 16.

The first insulation layer 17 and the second insulation layer 18 may include a single layer including an oxide layer, a nitride layer or an oxynitride layer, or a stacked layer including two or more of the aforementioned layers. The first insulation layer 17 and the second insulation layer 18 may include different insulation materials. For example, the first insulation layer 17 may include a nitride layer, and the second insulation layer 18 may include an oxide layer.

Figure 3E:
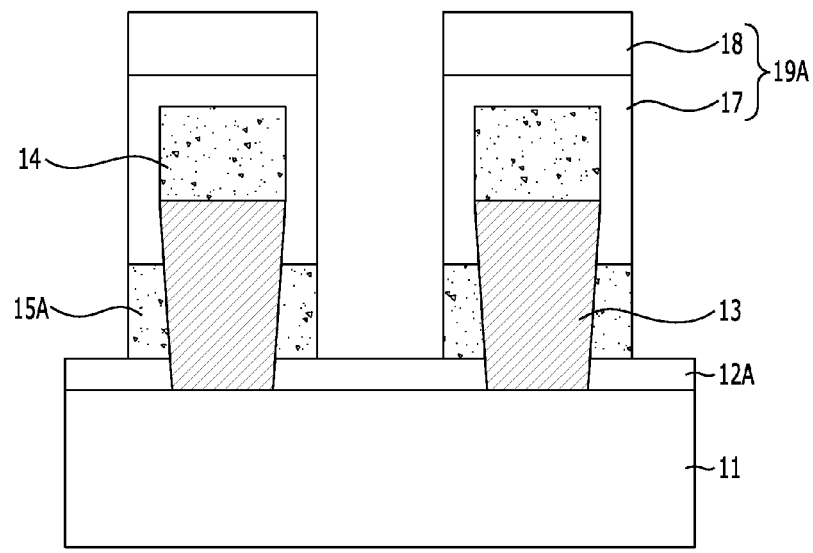

Referring to FIG. 3E, the second variable resistance pattern 15 the first insulation layer 17, and the second insulation layer 18 are selectively etched until the first inter-layer dielectric layer 12A is exposed. Thus, a protective layer 19 is formed to cover the first variable resistance pattern 14. At the same time, the second variable resistance pattern 15 which is formed between the two adjacent lower contact plugs 13 are etched, and thus, the two adjacent lower contact plugs are separated from each other. Hereafter, the second variable resistance pattern 15, the first insulation layer 17 and the second insulation layer 18, which are etched, are indicated as reference numerals '15A', '17A' and '18A', respectively.

As described above, the protective layer 19 may be formed to cover the first variable resistance pattern 14 and a portion of a sidewall of the lower contact plug 13 through an etch process. The sidewalls of the second variable resistance pattern 15A which surrounds the lower contact plug 13 between the first inter-layer dielectric layer 12A and the protective layer 19 may be aligned to the sidewalls of the protective layer 19.

Figure 3F:
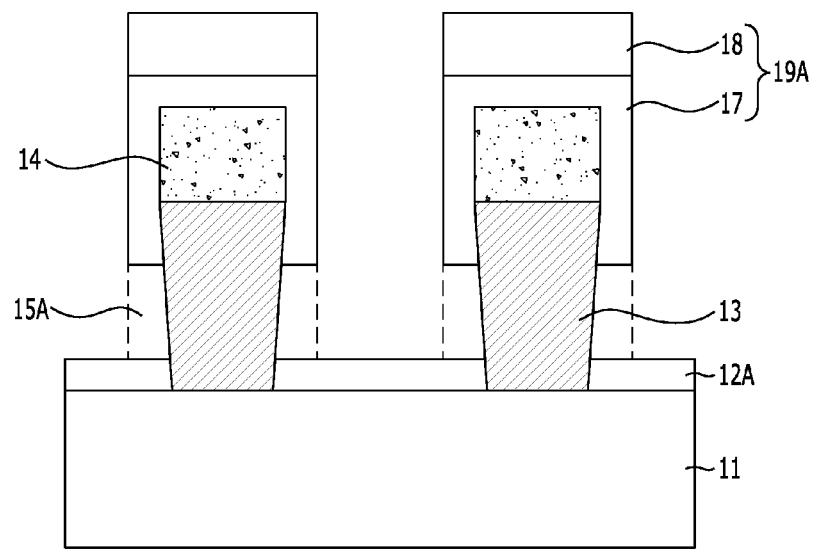

Referring to FIG. 3F, the second variable resistance pattern 15A which surrounds the lower contact plug 13 between the first inter-layer dielectric layer 12A and the protective layer 19 is eliminated. The second variable resistance pattern 15A may be eliminated through a wet etch process.

Meanwhile, since the remaining second variable resistance pattern 15A is a dummy pattern that does not have an any electrical influence on the semiconductor memory, the second variable resistance pattern 15A may remain without being eliminated (refer to FIG. 2). In FIG. 3E, the second insulation layer 18, the first insulation layer 17 and the second variable resistance pattern 15 may be not etched until the first inter-layer dielectric layer 12A is exposed. The second insulation layer 18 and the first insulation layer 17 may be selectively etched until the second variable resistance pattern 15 is exposed. The remaining second variable resistance pattern 15A may be completely eliminated, thereby preventing any interferences or bridges from occurring between the lower contact plugs disposed adjacent to each other.

Figure 3G:
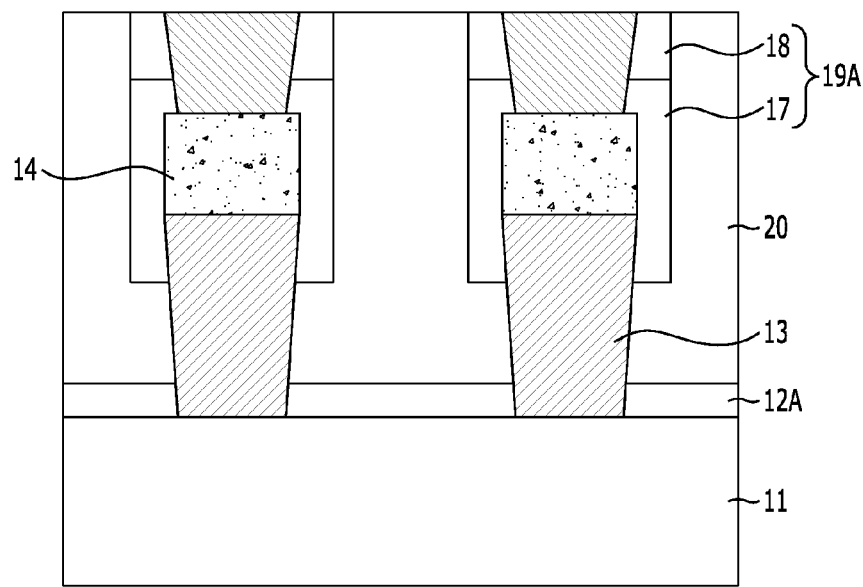

Referring to FIG. 3G, a second inter-layer dielectric layer 20 is formed to gap-fill the resultant structure including the protective layer 19. The second inter-layer dielectric layer 20 may include a single layer including an oxide layer, a nitride layer or an oxynitride layer, or a stacked layer including two or more of the aforementioned layers.

An upper contact plug 21 is formed to contact the first variable resistance pattern 14 by passing through or penetrate the protective layer 19. The upper contact plug 21 may serve as an electrode of the first variable resistance pattern 14.

The upper contact plug 21 may be formed through a series of processes including forming a contact hole by selectively etching the protective layer 19, forming a conductive layer over the contact hole so as to gap-fill the contact hole, and performing a planarization process on the conductive layer until the second inter-layer dielectric layer 20 is exposed so that the upper contact plugs 21 disposed adjacent to each other are isolated from each other. The planarization process may be performed through a Chemical Mechanical Polishing (CMP) process or a blanket etch process, e.g., an etch-back process. The upper contact plug 21 may have inclined sidewalls by forming the contact hole through an etch process.

The upper contact plug 21 which gap-fills and form the contact hole may include a conductive material having excellent embedding characteristics and high electrical conductivity such as tungsten (W), tantalum (Ta), aluminum (Al) or a titanium nitride (TiN). The upper contact plug 21 may include a single layer including one conductive material, or a stacked layer including two or more conductive materials.

Although it is not shown in the drawing, the semiconductor memory may complete by using a widely-known semiconductor fabrication technology.

According to the method for fabricating the semiconductor memory as described above, the first variable resistance pattern 14 may be formed to have vertical sidewalls while being self-isolated and self-aligned to the edge of the lower contact plug 13 without a subsequent etch process. This is accomplished by forming the variable resistance layer through a deposition process with the poor step coverage in a state where the lower contact plug 13 protrudes over the first inter-layer dielectric layer 12A. Consequently, problems caused by an etch process required for forming a storage element, e.g., the first variable resistance pattern 14, may be fundamentally prevented.

An electronic device including a semiconductor memory and a method for fabricating the electronic device in accordance with the implementations provide the benefits of greatly improving the reliability of the semiconductor memory. Such benefits can be provide by forming a variable resistance pattern which is self-isolated through a lower contact plug protruding over an inter-layer dielectric layer. In addition, the variable resistance pattern is formed to have vertical sidewalls.

The above and other memory circuits or semiconductor devices based on the disclosed technology can be used in a range of devices or systems. FIGS. 4-8 provide some examples of devices or systems that can implement the memory circuits disclosed herein.

Figure 4:
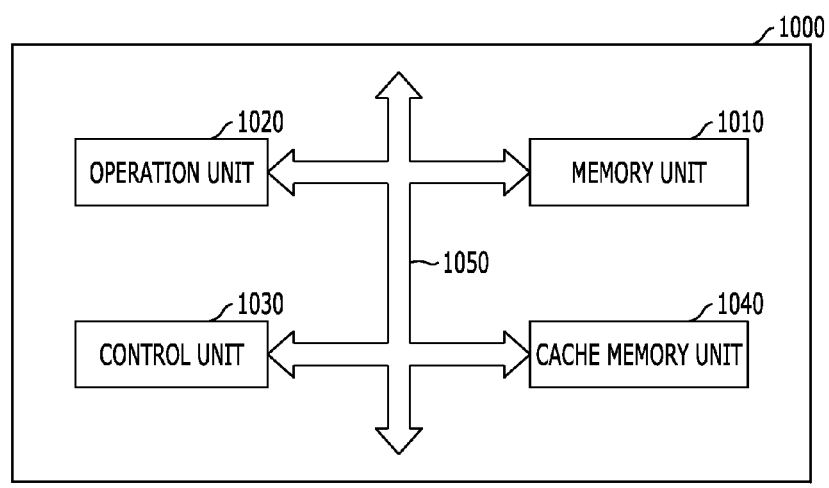
FIG. 4 is an example of configuration diagram of a microprocessor implementing memory circuitry based on the disclosed technology.

FIG. 4 is an example of configuration diagram of a microprocessor implementing memory circuitry based on the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include an electronic device may include a semiconductor memory that comprises: an inter-layer dielectric layer which may be formed over a substrate; a contact plug which may be coupled with the substrate by passing through or penetrating the inter-layer dielectric layer and has a protruding portion over the inter-layer dielectric layer; a first variable resistance pattern which may be formed over the contact plug; and a protective layer which covers the first variable resistance pattern and a portion of sidewalls of the contact plug in such a manner that the sidewalls of the contact plug may be exposed. Through this, a process margin of the memory unit 1010 may be secured, and a deterioration of device is prevented. Thus, the data storage characteristics of the memory unit 1010 may be improved in case that the transistor is coupled to a memory element, for example, a variable resistance element. As a consequence, a fabrication process of the microprocessor 1000 may become easier and performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
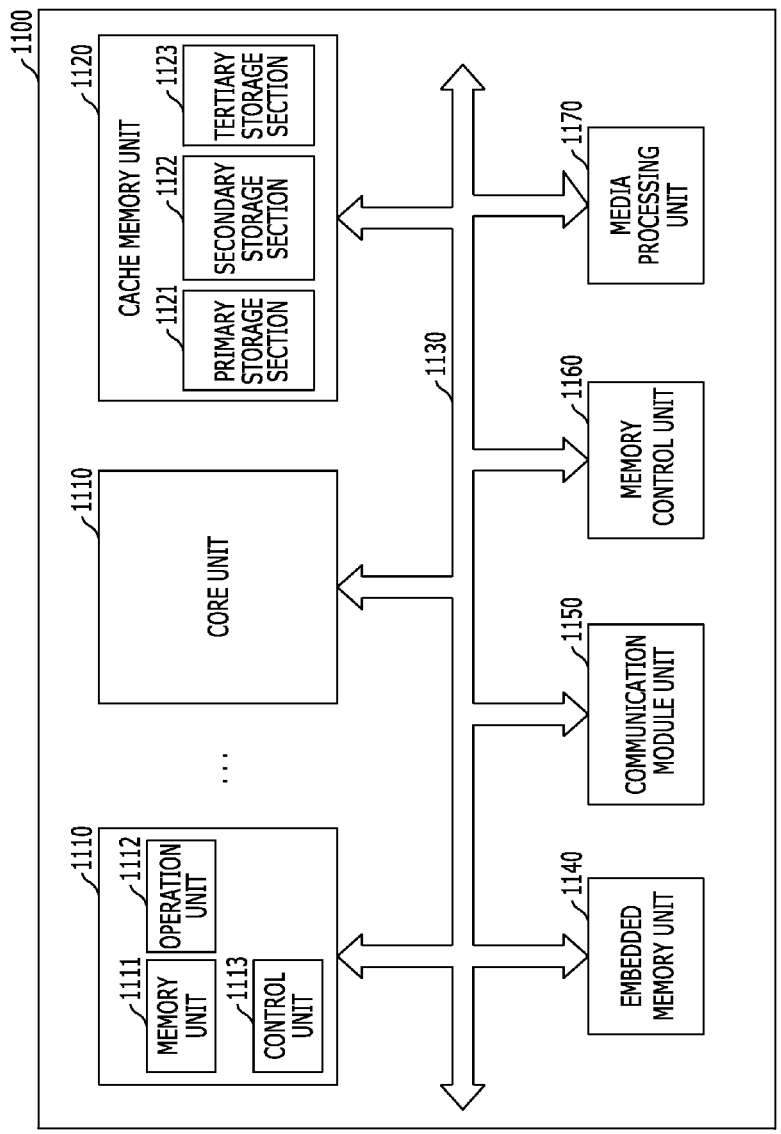
FIG. 5 is an example of configuration diagram of a processor implementing memory circuitry based on the disclosed technology.

FIG. 5 is an example of configuration diagram of a processor implementing memory circuitry based on the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include an electronic device may include a semiconductor memory that comprises: an inter-layer dielectric layer which may be formed over a substrate; a contact plug which may be coupled with the substrate by passing through or penetrating the inter-layer dielectric layer and has a protruding portion over the inter-layer dielectric layer; a first variable resistance pattern which may be formed over the contact plug; and a protective layer which covers the first variable resistance pattern and a portion of sidewalls of the contact plug in such a manner that the sidewalls of the contact plug may be exposed. Through this, a process margin of the cache memory unit 1120 may be secured, and a deterioration of device is prevented. Thus, the data storage characteristics of the cache memory unit 1120 can be improved in case that the transistor is coupled to a memory element, for example, a resistance variable element. As a consequence, a fabrication process of the microprocessor 1000 may become easier and performance characteristics of the processor 1100 may be improved.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
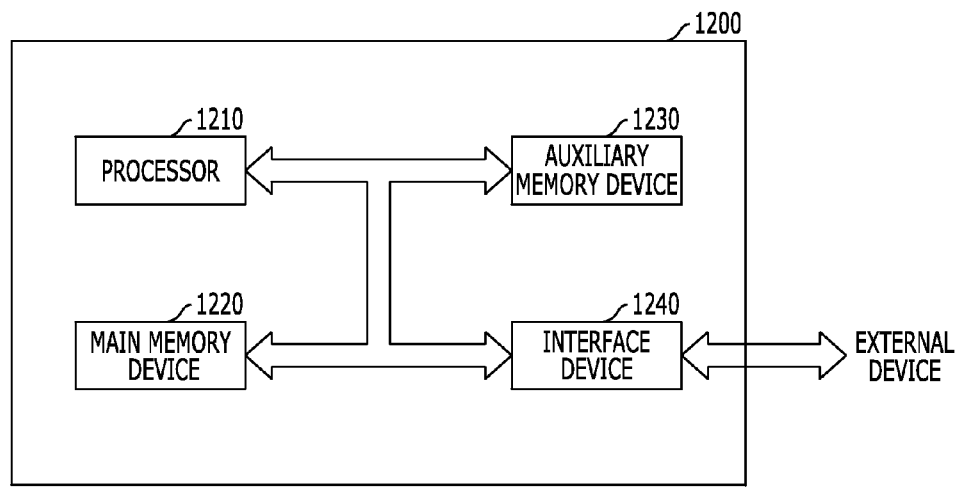
FIG. 6 is an example of configuration diagram of a system implementing memory circuitry based on the disclosed technology.

FIG. 6 is an example of configuration diagram of a system implementing memory circuitry based on the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include an electronic device may include a semiconductor memory that comprises: an inter-layer dielectric layer which may be formed over a substrate; a contact plug which may be coupled with the substrate by passing through or penetrating the inter-layer dielectric layer and has a protruding portion over the inter-layer dielectric layer; a first variable resistance pattern which may be formed over the contact plug; and a protective layer which covers the first variable resistance pattern and a portion of sidewalls of the contact plug in such a manner that the sidewalls of the contact plug may be exposed. Through this, a process margin of the main memory device 1220 may be secured, and a deterioration of device is prevented. Thus, the data storage characteristics of the main memory device 1220 can be improved in case that the transistor is coupled to a memory element, for example, a resistance variable element. As a consequence, a fabrication process of the processor 1210 may become easier and performance characteristics of the microprocessor 1000 may be improved. Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include an electronic device may include a semiconductor memory that comprises: an inter-layer dielectric layer which may be formed over a substrate; a contact plug which may be coupled with the substrate by passing through or penetrating the inter-layer dielectric layer and has a protruding portion over the inter-layer dielectric layer; a first variable resistance pattern which may be formed over the contact plug; and a protective layer which covers the first variable resistance pattern and a portion of sidewalls of the contact plug in such a manner that the sidewalls of the contact plug may be exposed. Through this, a process margin of the auxiliary memory device 1230 may be secured, and a deterioration of device is prevented. Thus, the data storage characteristics of the auxiliary memory device 1230 can be improved in case that the transistor is coupled to a memory element, for example, a resistance variable element. As a consequence, a fabrication process of the microprocessor 1000 may become easier and performance characteristics of the microprocessor 1000 may be improved. Also, the auxiliary memory device 1230 may further include a data storage system (see the reference numeral 1300 of FIG. 6) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 6) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
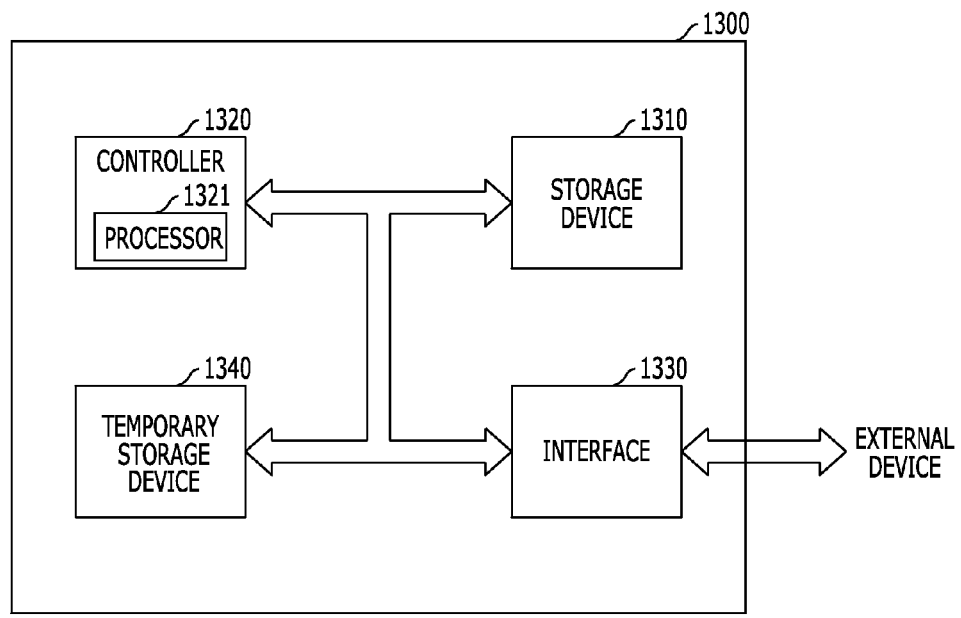
FIG. 7 is an example of configuration diagram of a data storage system implementing memory circuitry based on the disclosed technology.

FIG. 7 is an example of configuration diagram of a data storage system implementing memory circuitry based on the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include an electronic device may include a semiconductor memory that comprises: an inter-layer dielectric layer which may be formed over a substrate; a contact plug which may be coupled with the substrate by passing through or penetrating the inter-layer dielectric layer and has a protruding portion over the inter-layer dielectric layer; a first variable resistance pattern which may be formed over the contact plug; and a protective layer which covers the first variable resistance pattern and a portion of sidewalls of the contact plug in such a manner that the sidewalls of the contact plug may be exposed. Through this, a process margin of the temporary storage device 1340 may be secured, and a deterioration of device is prevented. Thus, the data storage characteristics of the temporary storage device 1340 may be improved in case that the transistor is coupled to a memory element, for example, a resistance variable element. As a consequence, a fabrication process of the data storage system 1300 may become easier and performance characteristics of the microprocessor 1000 may be improved.

Figure 8:
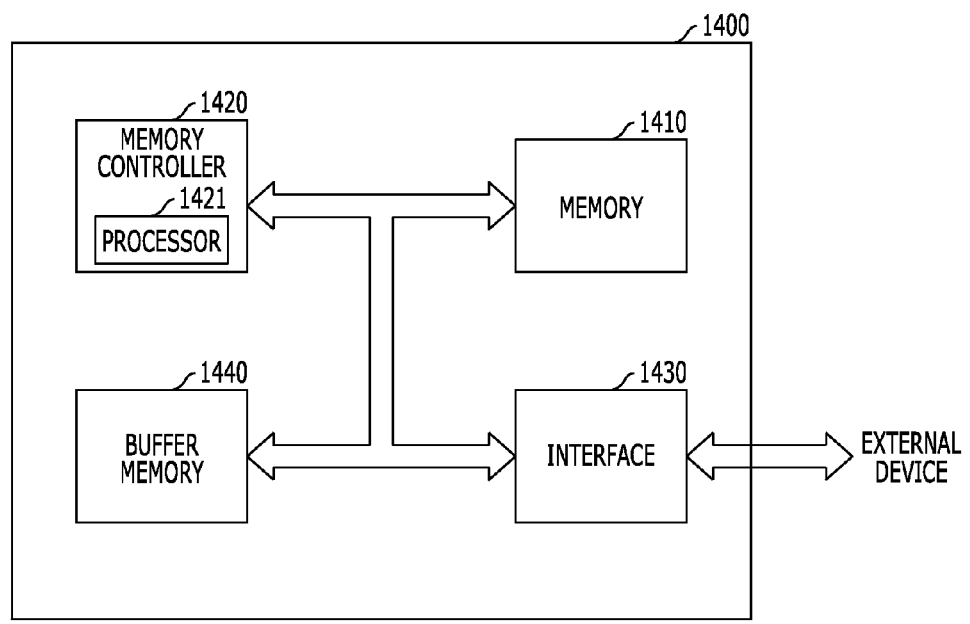
FIG. 8 is an example of configuration diagram of a memory system implementing memory circuitry based on the disclosed technology.

FIG. 8 is an example of configuration diagram of a memory system implementing memory circuitry based on the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include an electronic device may include a semiconductor memory that comprises: an inter-layer dielectric layer which may be formed over a substrate; a contact plug which may be coupled with the substrate by passing through or penetrating the inter-layer dielectric layer and has a protruding portion over the inter-layer dielectric layer; a first variable resistance pattern which may be formed over the contact plug; and a protective layer which covers the first variable resistance pattern and a portion of sidewalls of the contact plug in such a manner that the sidewalls of the contact plug may be exposed. Through this, a process margin of the memory 1410 may be secured, and a deterioration of device is prevented. Thus, the data storage characteristics of the memory 1410 can be improved in case that the transistor is coupled to a memory element, for example, a resistance variable element. As a consequence, a fabrication process of the memory system 1400 may become easier and performance characteristics of the microprocessor 1000 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include an electronic device may include a semiconductor memory that comprises: an inter-layer dielectric layer which may be formed over a substrate; a contact plug which may be coupled with the substrate by passing through or penetrating the inter-layer dielectric layer and has a protruding portion over the inter-layer dielectric layer; a first variable resistance pattern which may be formed over the contact plug; and a protective layer which covers the first variable resistance pattern and a portion of sidewalls of the contact plug in such a manner that the sidewalls of the contact plug may be exposed. Through this, a process margin of the buffer memory 1440 may be secured, and a deterioration of device is prevented. Thus, the data storage characteristics of the memory unit 1010 can be improved in case that the transistor is coupled to a memory element, for example, a resistance variable element. As a consequence, a fabrication process of the memory system 1400 may become easier and performance characteristics of the microprocessor 1000 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 4-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory that includes:
   a substrate;
   an inter-layer dielectric layer which is formed over the substrate;
   a contact plug which is coupled with the substrate by passing through the inter-layer dielectric layer and has a protruding portion over the inter-layer dielectric layer;
   a first variable resistance pattern which is formed over the contact plug; and
   a protective layer which covers the first variable resistance pattern and a portion of sidewalls of the contact plug in such a manner that exposes a remaining portion of the sidewalls of the contact plug.

2. The electronic device according to claim 1, further comprising:
   a second variable resistance pattern which is formed to surround a portion of the remaining portion of the sidewalls of the contact plug.

3. The electronic device according to claim 2, wherein the sidewalls of the second variable resistance pattern is aligned to the sidewalls of the protective layer.

4. The electronic device according to claim 2, wherein the first variable resistance pattern and the second variable resistance pattern are spaced apart from each other in a vertical direction.

5. The electronic device according to claim 2, wherein the second variable resistance pattern includes the same material as the first variable resistance pattern.

6. The electronic device according to claim 2, wherein the first variable resistance pattern includes a magnetic tunnel junction including a tunnel barrier interposed between two magnetic materials, and the second variable resistance pattern includes a magnetic material for improving a characteristic of the magnetic tunnel junction.

7. The electronic device according to claim 1, wherein the protective layer includes:
   a first insulation layer which is formed over a surface of a structure to cover the first variable resistance pattern and a portion of the sidewalls of the contact plug; and
   a second insulation layer over the first insulation layer corresponding to the upper surface of the first variable resistance pattern.

8. The electronic device according to claim 1, wherein the height of the contact plug protruding over the inter-layer dielectric layer is greater than the height of the first variable resistance pattern.

9. An electronic device, comprising:
   a substrate;
   an inter-layer dielectric layer which is formed over the substrate;
   lower contact plugs formed through the inter-layer dielectric layer and having protruding portions over the inter-layer dielectric layer;
   first variable resistance patterns formed over and in electrical contact with the lower contact plugs, respectively, so that the first variable resistance patterns are located above and separated from the inter-layer dielectric layer;
   upper contact plugs formed over and in electrical contract with the first variable resistance patterns, respectively so that each first variable resistance pattern is in electrical contact between a corresponding upper contact plug and a corresponding lower contact plug; and
   a magnetic structure formed over the substrate and located below top portions of lower contact plugs so as to be separated from the first variable resistance patterns, the magnetic structure producing a magnetic field at the first variable resistance patterns,
   wherein each first variable resistance pattern is isolated by a corresponding lower contact plug protruding over the inter-layer dielectric layer.

10. The electronic device according to claim 9, further including:
    protective layers formed around the first variable resistance patterns, respectively, each covering a corresponding first variable resistance pattern and a portion of sidewalls of a corresponding lower contact plug while exposing a remaining portion of the sidewalls of the corresponding lower contact plug; and
    wherein each upper contact plug for a corresponding first variable resistance pattern passes through a corresponding protective layer for the corresponding first variable resistance pattern.

11. The electronic device according to claim 10, wherein each protective layer includes:
    a first insulation layer which is formed over a surface of a structure to cover a corresponding first variable resistance pattern and a portion of the sidewalls of a corresponding lower contact plug; and
    a second insulation layer over the first insulation layer corresponding to the upper surface of the corresponding first variable resistance pattern.

12. The electronic device according to claim 9, wherein:
    the magnetic structure includes a second variable resistance pattern that surrounds the exposed sidewalls of the lower contact plug.

13. The electronic device according to claim 12, wherein each first variable resistance pattern and the second variable resistance pattern are spatially separated by placing the second variable resistance pattern below each first variable resistance pattern.

14. The electronic device according to claim 12, wherein each second variable resistance pattern includes the same structure and materials as the first variable resistance pattern.

15. The electronic device according to claim 12, wherein each first variable resistance pattern includes a magnetic tunnel junction including tunnel barrier interposed between two magnetic materials, and each second variable resistance pattern includes a magnetic material for improving a characteristic of the magnetic tunnel junction.

16. The electronic device according to claim 9, wherein the height of the lower contact plugs protruding over the inter-layer dielectric layer is greater than the height of the first variable resistance patterns.

17. An electronic device, comprising:
    a substrate;
    an inter-layer dielectric layer which is formed over the substrate;
    lower contact plugs formed through the inter-layer dielectric layer and having protruding portions over the inter-layer dielectric layer, each protruding portions distantly spaced from each other; and
    first variable resistance patterns respectively formed over the lower contact plugs, each variable resistance pattern being in electrical contact with a corresponding lower contact plug, and each variable resistance pattern including a first magnetic layer having a variable magnetization direction, a second magnetic layer having a pinned magnetization direction, and a tunnel barrier layer interposed between the first magnetic layer and the second magnetic layer, wherein each variable resistance pattern is distantly formed from the inter-layer dielectric layer and has a vertical profile aligned with an edge of a corresponding lower contact plug.

18. The electronic device of claim 17, further including:

magnetic structures formed around the lower contact plugs over the inter-layer dielectric layer, respectively, to be spaced apart from the first variable resistance elements, wherein each magnetic structure produces a magnetic field at the first magnetic layer of a corresponding first variable resistance element to prevent a magnetic field produced by the second magnetic layer to bias the first magnetic layer.

19. The electronic device of claim 18, wherein:

The magnetic structures are second variable resistance elements which have the same structures as the first variable resistance elements.

20. The electronic device of claim 17, wherein the height of the lower contact plug protruding over the first inter-layer dielectric layer is greater than the height of the first variable resistance pattern.

* * * * *